US009844011B2

United States Patent
Sahlin et al.

(10) Patent No.: US 9,844,011 B2
(45) Date of Patent: Dec. 12, 2017

(54) METHOD AND NETWORK NODE FOR HANDLING AGC AND TPC SCALING

(71) Applicant: Telefonaktiebolaget LM Ericsson (publ), Stockholm (SE)

(72) Inventors: Henrik Sahlin, Mölnlycke (SE); Anders Persson, Kode (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 42 days.

(21) Appl. No.: 14/916,370

(22) PCT Filed: Sep. 16, 2013

(86) PCT No.: PCT/EP2013/069103
§ 371 (c)(1),
(2) Date: Mar. 3, 2016

(87) PCT Pub. No.: WO2015/036049
PCT Pub. Date: Mar. 19, 2015

(65) Prior Publication Data
US 2016/0219533 A1 Jul. 28, 2016

(51) Int. Cl.
*G08C 17/00* (2006.01)
*H04W 52/52* (2009.01)
(Continued)

(52) U.S. Cl.
CPC ......... *H04W 52/52* (2013.01); *H04L 25/0202* (2013.01); *H04L 25/0232* (2013.01);
(Continued)

(58) Field of Classification Search
CPC .. H04W 52/52; H04W 52/40; H04L 25/0202; H04L 25/0236; H04L 25/0232; H03G 3/3042; H03G 3/3089
(Continued)

(56) References Cited

U.S. PATENT DOCUMENTS 8,060,035 B2 * 11/2011 Haykin ................. H04L 5/0037
455/115.1
8,442,440 B2 * 5/2013 Memik ............... H04W 72/085
455/423
(Continued)

FOREIGN PATENT DOCUMENTS

| EP | 1727292 A1 | 11/2006 |
| EP | 1826971 A1 | 8/2007 |
| WO | 2012118415 A1 | 9/2012 |

OTHER PUBLICATIONS

3rd Generation Partnership Project, "3rd Generation Partnership Project; Technical Specification Group Radio Access Network; Physical layer procedures (FDD) (Release 11)", Technical Specification, 3GPP TS 25.214 V11.5.0, Feb. 1, 2013, pp. 1-227, 3GPP, France.
(Continued)

*Primary Examiner* — Chuong T Ho
(74) *Attorney, Agent, or Firm* — Coats & Bennett, PLLC

(57) ABSTRACT

The embodiments herein relate to a method in a first network node (301) for handling Automatic Gain Control, AGC, scaling and Transmit Power Control, TPC, scaling of a signal received from a second network node (305). The first network node AGC compensates the signal for any AGC scaling changes. The AGC compensating the signal results in an AGC compensated signal comprising a constant AGC scaling. The first network node detects a TPC scaling change of the signal. The detection is based on the signal after the TPC scaling change and based on a predicted channel estimate. The predicted channel estimate is based on the signal before the TPC scaling change. The first network node TPC compensates for the detected TPC scaling change. The TPC compensation results in an AGC and TPC compensated signal comprising the constant AGC scaling and a constant TPC scaling according to the detected TPC scaling change.

22 Claims, 13 Drawing Sheets

(51) Int. Cl.
*H04L 25/02* (2006.01)
*H04W 52/40* (2009.01)
*H03G 3/30* (2006.01)

(52) U.S. Cl.
CPC ......... *H04L 25/0236* (2013.01); *H04W 52/40* (2013.01); *H03G 3/3042* (2013.01); *H03G 3/3089* (2013.01)

(58) Field of Classification Search
USPC .................................................. 370/311, 312
See application file for complete search history.

(56) References Cited

U.S. PATENT DOCUMENTS

| | | | | |
|---|---|---|---|---|
| 8,938,200 | B2* | 1/2015 | Haykin | H04L 5/0037 455/62 |
| 2005/0141459 | A1* | 6/2005 | Li | H04B 7/0417 370/334 |
| 2007/0230635 | A1 | 10/2007 | Wilhelmsson et al. | |
| 2008/0013499 | A1* | 1/2008 | Ratasuk | H04W 52/16 370/338 |
| 2008/0102873 | A1* | 5/2008 | Kumar | H04W 52/146 455/522 |
| 2009/0047916 | A1* | 2/2009 | Haykin | H04L 5/0037 455/115.1 |
| 2009/0052570 | A1* | 2/2009 | Haykin | H04L 5/0037 375/267 |
| 2011/0021152 | A1* | 1/2011 | Memik | H04W 72/02 455/62 |
| 2011/0028097 | A1* | 2/2011 | Memik | H04W 72/085 455/62 |
| 2011/0028100 | A1* | 2/2011 | Memik | H04W 16/14 455/67.11 |
| 2011/0028107 | A1* | 2/2011 | Memik | H04W 48/08 455/114.2 |
| 2012/0069934 | A1* | 3/2012 | Jiang | H04L 1/0053 375/316 |
| 2012/0270583 | A1* | 10/2012 | Haykin | H04L 5/0037 455/507 |
| 2013/0039403 | A1* | 2/2013 | Haykin | H04L 5/0037 375/224 |
| 2013/0242868 | A1* | 9/2013 | Kostic | H04B 1/7115 370/328 |

OTHER PUBLICATIONS

3rd Generation Partnership Project, "3rd Generation Partnership Project; Technical Specification Group Radio Access Network; Physical channels and mapping of transport channels onto physical channels (FDD) (Release 11)", Technical Specification, 3GPP TS 25.211 V11.3.0, Feb. 1, 2013, pp. 1-63, 3GPP, France.

\* cited by examiner

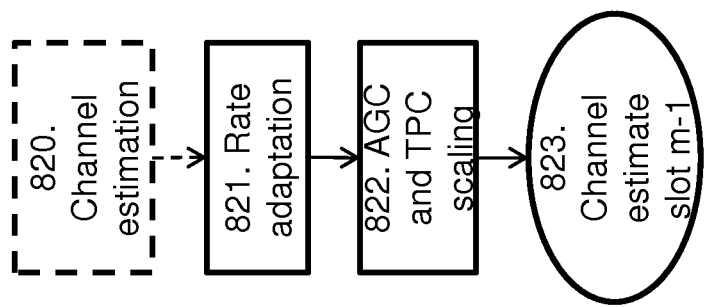
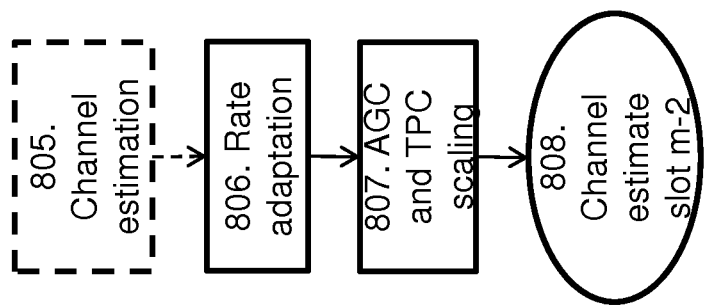
Fig. 8b

METHOD AND NETWORK NODE FOR HANDLING AGC AND TPC SCALING

TECHNICAL FIELD

Embodiments herein relate generally to a first network node and a method in the first network node. More particularly the embodiments herein relate to handling Automatic Gain Control (AGC) scaling and Transmit Power Control (TPC) scaling of a signal received from a second network node.

BACKGROUND

In a typical communications network, a wireless device communicates via a Radio Access Network (RAN) to one or more Core Networks (CNs). The communications network may also be referred to as e.g. a wireless communications network, a wireless communications system, a communications network, a communications system, a network or a system.

The wireless device may be a device by which a subscriber may access services offered by an operator's network and services outside operator's network to which the operator's radio access network and core network provide access, e.g. access to the Internet. The wireless device may be any device, mobile or stationary, enabled to communicate over a radio channel in the communications network, for instance but not limited to e.g. user equipment, mobile phone, smart phone, sensors, meters, vehicles, household appliances, medical appliances, media players, cameras, Machine to Machine (M2M) device or any type of consumer electronic, for instance but not limited to television, radio, lighting arrangements, tablet computer, laptop or Personal Computer (PC). The wireless device may be portable, pocket storable, hand held, computer comprised, or vehicle mounted devices, enabled to communicate voice and/or data, via the radio access network, with another entity, such as another wireless device or a server.

The wireless device is enabled to communicate wirelessly within the communications network. The communication may be performed e.g. between two wireless devices, between a wireless device and a regular telephone, between the wireless device and a network node, between network nodes, and/or between the wireless device and a server via the radio access network and possibly one or more core networks and possibly the Internet.

The communications network may cover a geographical area which may be divided into cell areas. Each cell area is served by a base station. The base station may be referred to as a Radio Base Station (RBS), evolved Node B (eNB), eNodeB, NodeB, B node, or Base Transceiver Station (BTS), depending on the technology and terminology used.

A radio communication between a wireless device and a base station may be affected by multi path propagation, fading, frequency errors, round trip times etc. The communication channel between the base station and the wireless device may be referred to as an air interface, and may cause bit and block errors on information transmitted using the communication channel. A receiver may be designed in order to reduce bit error and block error rates which, among others, comprise channel estimation, antenna combining, equalization and demodulation. An accurate channel estimate may be crucial for equalization and thus also for demodulation and decoding of the user data.

The wireless device may change the amplitude of an uplink transmitted signal depending on TPC commands, which are received in downlink from a base station. Furthermore, the received signal may also be scaled by an AGC by the base station. The channel estimate should thus vary according to both the fading radio channel and these changes in amplitude due to TPC commands in the wireless device and the AGC in the base station. The wireless device may be seen as a transmitter and the base station may be seen as a receiver. Uplink may be defined as the direction from the wireless device to the base station, and downlink may be defined as the direction from the base station to the wireless device.

In e.g. a Wideband Code Division Multiple Access (WCDMA) network one key component is to maintain a received Signal to Interference plus Noise Ratio (SINR) at a constant level to preserve the quality of the received information at a desired level. SINR is a measure of signal strength relative to background noise and interference. The base station receives a signal from the wireless device and measures the SINR of the received signal, and then the measured SINR value is compared with a SINR threshold-value to generate a TPC command. The TPC command is sent to the wireless device and indicates to the wireless device whether it should increase or decrease its transmitting power. The wireless device adjusts its transmitting power based on the received TPC command. The adjustment may take place for example once for a time slot. A time slot, also referred to as slot, may be described as being a kind of a time interval, a time assigned on a schedule, an allocated period of time etc. A time slot may be transmitted in either the uplink or downlink direction. In some embodiments, time slots may be dynamically assigned in order to provide variable and asymmetrical data transmission rates. Using WCDMA as an example, where both uplink and downlink data channels are segmented into time slots and frames. Such slot may be e.g. 666.667 psec in length, and fifteen of these time slots are concatenated to form a 10 millisecond (ms) frame. Using LTE as an example, a frame and slots may be of various lengths. For example, a frame may have an overall length of 10 ms and this is then divided into 20 individual slots.

If the wireless device moves towards the base station, the signal strength increases and causes an increased interference level as seen by other wireless devices. In this case, the base station needs to send an instruction to the wireless device to reduce its transmission power as it moves towards the base station. If the wireless device moves away from the base station it may suffer from increased path loss. In this case, the base station needs to send an instruction to the wireless device to increase its transmission power as it moves away from the base station.

According to some embodiments of the Third Generation Partnership Project (3GPP), the wireless device's transmission power may be updated each 0.667 ms based on a signal quality measurement done in the base station. 3GPP describes two different inner loop power control algorithms. In the inner loop power control, the base station sends an UpLink (UL) TPC command to the wireless device comprising instructions to increase or decrease its transmission power. The wireless device adjusts its transmission power according to the TPC command and sends a signal according to the adjusted transmission (Tx) power, back to the base station.

A description of TPC scaling within the wireless device in uplink for WCDMA is given in section 5.1.2.2 of 3GPP TS 25.214, V.11.5.0. In 3GPP TS 25.214, V.11.5.0 two alternative algorithms, algorithms 1 and 2, are supported in the wireless device of how to derive the TPC scaling. The selection of which algorithm to use is specific for the wireless device, and the selection is specified by the network. The TPC scaling is denoted by $\Delta_{DPCCH}$ in the following description.

For "Algorithm 1":
  If the received TPC command is equal to 1, then $\Delta_{DPCCH}$=+1 dB or +2 dB for that slot.
  If the received TPC command is equal to 0, then $\Delta_{DPCCH}$=−1 dB or −2 dB for that slot.
+ indicates that the wireless should increase the power and − indicates that the wireless device should reduce the power.

For "algorithm 2":
  For the first four slots of a set, then $\Delta_{DPCCH}$=0 dB.
  For the fifth slot of a set, the wireless device uses hard decisions on each of the five received TPC commands as follows:
    If all five hard decisions within a set are 1 then $\Delta_{DPCCH}$=+1 dB in the 5th slot.
    If all 5 hard decisions within a set are 0 then $\Delta_{DPCCH}$=−1 dB in the 5th slot.
    Otherwise, $\Delta_{DPCCH}$=0 dB in the 5th slot.

A hard decision of a TPC command is a binary decision of either "1" or "0" without any information of the probability, quality measure or other judgment of this decision. TPC steps inside the channel estimation may be compensated for. Compensation for TPC steps inside the channel estimation was suggested in WO 2012/118415. In WO 2012/118415, the knowledge of TPC is achieved by assuming that the wireless device is not in handover and that the time delay of the TPC commands can be estimated.

The term handover mentioned above may be described as the process of transferring an ongoing call or data session from one channel connected to the core network to another. The term channel estimation mentioned above, may be performed by a channel estimator and may be described as to estimation of the frequency response of the path between the transmitter and receiver. The channel estimation may be used to optimize performance and maximize the transmission rate.

The wireless device may change the amplitude of the uplink transmitted signal depending on at least one TPC command. As mentioned above, these TPC commands are determined by the base station and transmitted on the downlink from the base station to the wireless device. However, the wireless device might simultaneously receive TPC commands from several base stations. In this case, the base station does not know if the wireless device is acting according to its transmitted TPC commands. A scenario in which a wireless device receives multiple TPC commands from several base stations is in handover between base stations. Thus, the processing with the receiver of the base station cannot rely upon that the wireless device follows the TPC commands which it transmits. Furthermore, the delay between transmitting the TPC commands in downlink until the wireless device uses the TPC command in the uplink is unknown.

AGC, which is an acronym for Automatic Gain Control or Automatic Gain Controller, may be found in any device or system where wide amplitude variations in the input signal may lead to a loss of information or to an unacceptable performance of the device or the system. This way, saturation of various circuit blocks in the device or system may be avoided. The role of the AGC is to automatically adjust the gain of an input signal in order to provide a relatively constant output amplitude. This means that units following the AGC require a smaller dynamic range. The AGC may also be described as an adaptive system where the average output signal level is fed back to adjust the gain to an appropriate level for a range of input signal levels. For example, without the AGC the sound emitted from an Amplitude Modulation (AM) radio receiver would vary to an extreme extent from a weak to a strong signal. The AGC effectively reduces the volume if the signal is strong and raises it when it is weaker.

The base station might be equipped by an AGC. This AGC scales the received signal such that the dynamic range of the signal is lowered. A low dynamic range is beneficial in order to reduce quantization errors and errors due to truncation of large values. Typically, this AGC scaling is only allowed to change at predefined time instants. Also, the amplitude and the time of the AGC scaling are known by the base station. Nevertheless, the scaling impacts the amplitude of the signals used in the channel estimator and in the equalizer.

A channel estimator typically tries to estimate the radio channel between the wireless device and the base station in the sense that the channel estimates follows both radio channel fading as well as TPC and AGC steps. Due to the inherit linear filtering in the channel estimator, the TPC steps and changes in AGC scaling will be smoothed into slowly time varying channel estimates, as illustrated in FIG. 1. FIG. 1 illustrates a true channel, i.e. an ideal channel estimate, and a channel estimation without TPC or AGC compensation. The x-axis in FIG. 1 represent slots number 115-130. The y-axis in FIG. 1 represents the real value of the channel at base station antenna 0. The crossed line in FIG. 1 represents real values of an ideal channel estimate. The circled line in FIG. 1 represents real values of a tracker channel estimator. In the illustration in FIG. 1, the TPC scalings are seen in changes of the amplitude by 1 dB between all slots. Changes in the AGC scaling may occur anywhere within a slot, but in this illustration the changes in AGC scaling also occurs between slots, see e.g. the change between slot 120 and 121 in FIG. 1. However, the changes in the AGC scaling typically occur at a lower rate than the amplitude changes due to the TPC scaling.

An illustration is given in FIG. 2 of a true channel, i.e. ideal channel estimate, and a channel estimate in which the received signal is compensated with TPC and AGC scaling before the processing in the channel estimator, such that the channel estimator has an input signal without amplitude changes due to the TPC scaling and changes in AGC scaling. The x-axis in FIG. 2 represent slots number 115-130. The y-axis in FIG. 2 represents the real value of the channel at base station antenna 0. The crossed line in FIG. 2 represents real values of an ideal channel estimate. The circled line in FIG. 2 represents real values from a tracker channel estimator when the received signal is compensated with TPC and AGC scalings. After the channel estimation, the amplitude steps of the signal due to the TPC scaling and changes in the AGC scaling are applied again to the estimated channel A channel estimates will deviate from the true the channel if the impact of the TPC scaling and the AGC scaling is not considered within the channel estimation, resulting in bit and block errors on the uplink communication link.

SUMMARY

An objective of embodiments herein is therefore to obviate at least one of the above disadvantages and to provide improved channel estimates in a communications network.

According to a first aspect, the object is achieved by a method in a first network node for handling AGC scaling and TPC scaling of a signal received from a second network node. The first network node AGC compensates the signal for any AGC scaling change. The AGC compensation results in an AGC compensated signal comprising a constant AGC scaling. The first network node detects a TPC scaling change of the signal. The detection is based on the signal after the TPC scaling change and based on a predicted channel estimate. The predicted channel estimate is based on the signal before the TPC scaling change. The first network node TPC compensates for the detected TPC scaling change. The TPC compensation results in an AGC and TPC compensated signal comprising the constant AGC scaling and a constant TPC scaling according to the detected TPC scaling change.

According to a second aspect, the object is achieved by a first network node for handling AGC scaling and TPC scaling of a signal received from a second network node. The first network node comprises an AGC compensating unit which is adapted to AGC compensate the signal for any AGC scaling change. The AGC compensation results in an AGC compensated signal comprising a constant AGC scaling. The first network node comprises a detector which is adapted to detect a TPC scaling change of the signal. The detection is based on the signal after the TPC scaling change and based on a predicted channel estimate. The predicted channel estimate is based on the signal before the TPC scaling change. The first network node comprises a TPC compensating unit which is adapted to TPC compensate for the detected TPC scaling change. The TPC compensation results in an AGC and TPC compensated signal comprising the constant AGC scaling and a constant TPC scaling according to the detected TPC scaling change.

Since the TPC scaling change is detected by comparing the amplitude of received signal before and after the TPC scaling change, and since both the amplitude changes due to AGC and TPC scaling are compensated before the channel estimation and re-applied to the estimated channel after the channel estimation processing, the channel estimates in the communications network are improved.

Embodiments herein afford many advantages, of which a non-exhaustive list of examples follows:

An advantage of the embodiments herein may be that they lead to improved channel estimates for the uplink. This improved channel estimate further leads to improved performance of the uplink communication in terms of less bit and block errors.

The improved channel estimates results in an improved demodulation of received user data signals. In the demodulation, the received signal is compensated by coefficients derived from the channel estimates. Examples of such demodulation structures are the RAKE and the GRAKE receivers.

The improved channel estimates also leads to improved calculation of demodulation thresholds. These thresholds are used in the calculation of soft values before channel decoding.

Another advantage of the embodiments herein is improved Doppler spread and Doppler shift estimates based on the TPC and AGC compensated received signal. The Doppler spread and Doppler shift are measures of the speed of wireless device in relation to the base station. Any frequency error between the base station and the wireless device is also included in the Doppler shift. When the received signal is compensated with AGC and detected TPC scalings, the amplitude variations of the received signal are mainly due to the movement of the wireless device and frequency errors. Thus, a better estimate of the Doppler shift and Doppler spread can thus be achieved.

The embodiments herein are not limited to the features and advantages mentioned above. A person skilled in the art will recognize additional features and advantages upon reading the following detailed description.

BRIEF DESCRIPTION OF THE DRAWINGS

The embodiments herein will now be further described in more detail in the following detailed description by reference to the appended drawings illustrating the embodiments and in which:

FIG. 8a-b is a signaling diagram illustrating embodiments of a method for use in the channel estimation for WCDMA.

The drawings are not necessarily to scale and the dimensions of certain features may have been exaggerated for the sake of clarity. Emphasis is instead placed upon illustrating the principle of the embodiments herein.

DETAILED DESCRIPTION

The embodiments herein detect the TPC commands by comparing the amplitude of received signal before and after the expected TPC scaling change. Also, both the amplitude changes due to AGC and TPC commands are compensated before channel estimation. The AGC and TPC commands are reapplied to the estimated channel after the channel estimation processing. In other words, the embodiments describe how to detect the TPC commands in a network node and how to compensate for both TPC and AGC scaling changes before the channel estimation and the TPC detection.

Figure 1:
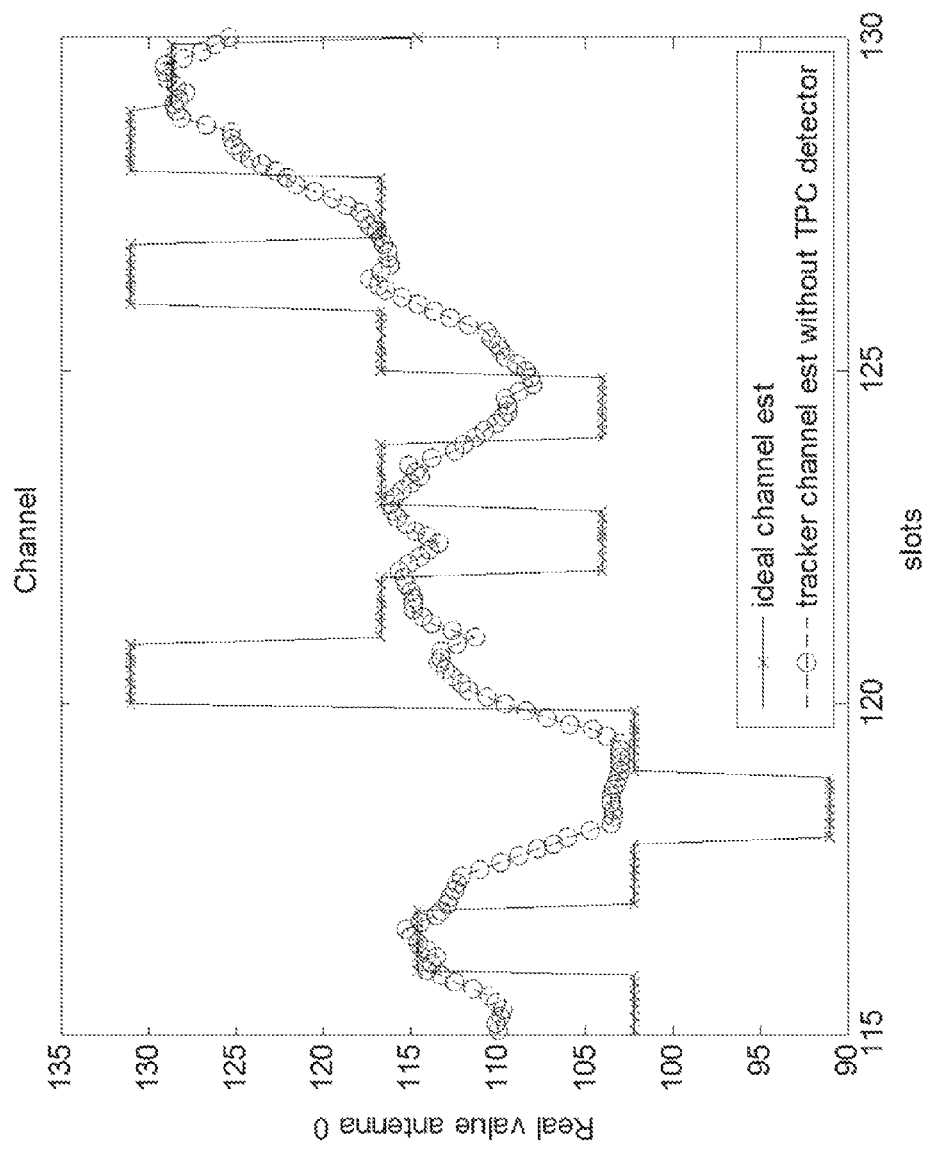
FIG. 1 are graphs illustrating embodiments of a true channel (ideal channel estimate) and channel estimation without TPC or AGC compensation.
Figure 2:
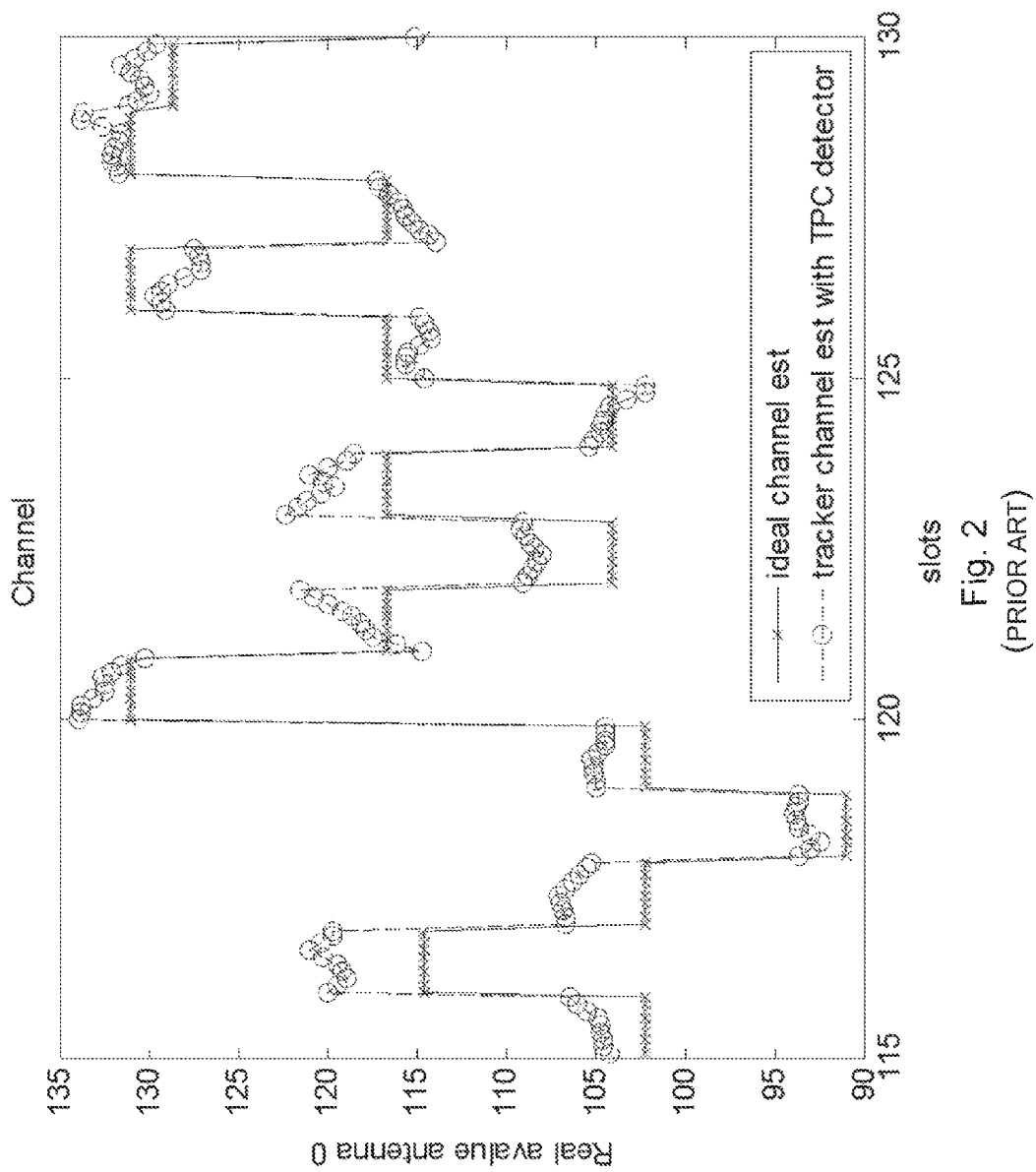
FIG. 2 are graphs Illustrating embodiments of a true channel (ideal channel estimate) and channel estimation with TPC and AGC compensation.
Figure 3:
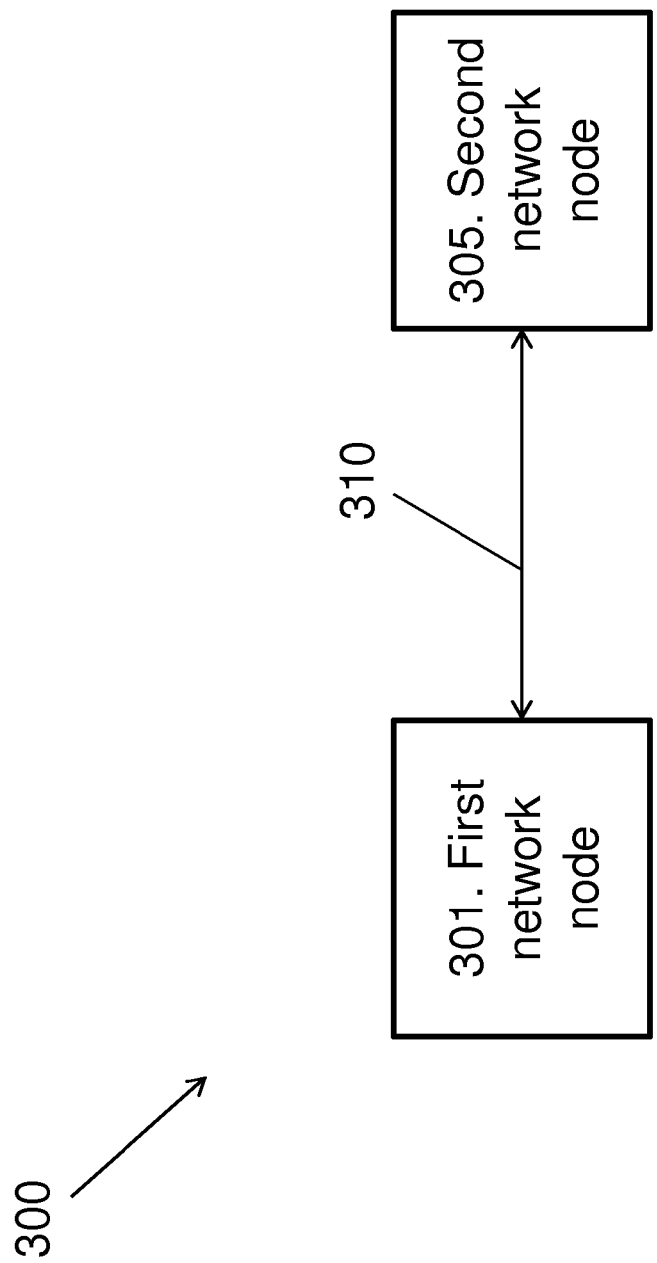
FIG. 3 is a schematic block diagram illustrating embodiments of a communications network.

FIG. 3 depicts a communications network 300 in which embodiments herein may be implemented. The communications network 300 may in some embodiments apply to one or more radio access technologies such as for example Long Term Evolution (LTE), LTE Advanced, WCDMA, Global System for Mobile Communications (GSM), Worldwide Interoperability for Microwave Access (WiMax), WiFi, or any other radio access technology, or other radio access technologies such as Wireless Local Area Network (WLAN).

The wireless communications network 300 comprises a first network node 301 which is adapted to communicate with a second network node 305 via a communication link 310. In some embodiments, the first network node 301 is a base station and the second network node is a wireless device. In other embodiments, the first network node 301 is a wireless device and the second network node 305 is a base station. In yet other embodiments, both nodes are wireless devices such as in a Device to Device (D2D) communication. Also, both nodes might be base stations or other stationary nodes, such as for wireless backhaul or relay nodes.

The base station may be a network node such as an eNB, NodeB, an eNodeB, Radio Network Controller (RNC), BTS or any other network unit capable to communicate via the communications link 310 with the wireless device.

The wireless device may be a device by which a subscriber may access services offered by an operator's network and services outside operator's network to which the operator's radio access network and core network provide access, e.g. access to the Internet. The wireless device may be any device, mobile or stationary, enabled to communicate over a radio channel in the communications network, for instance but not limited to e.g. user equipment, mobile phone, smart phone, sensors, meters, vehicles, household appliances, medical appliances, media players, cameras, M2M device or any type of consumer electronic, for instance but not limited to television, radio, lighting arrangements, tablet computer, laptop or PC. The wireless device may be portable, pocket storable, hand held, computer comprised, or vehicle mounted devices, enabled to communicate voice and/or data, via the radio access network, with another entity, such as another wireless device or a server.

It should be noted that the communications link 310 between the first network node 301 and the second network node 305 may be of any suitable kind comprising either a wired or wireless link. The link may use any suitable protocol depending on type and level of layer (e.g. as indicated by the Open Systems Interconnection (OSI) model) as understood by the person skilled in the art.

The method for handling AGC scaling and TPC scaling of a signal received from a second network node 305, according to some embodiments will now be described with reference to the flowchart depicted in FIG. 4. The signal may be a reference signal. The method comprises the following steps, which steps may as well be carried out in another suitable order than described below.

Step 401

The first network node 301 receives the reference signal from the second network node 305. In some embodiments, the reference signal comprises symbols such as e.g. pilot symbol(s) and non-pilot symbol(s). In some embodiments, the reference signal is referred to as reference symbols or samples of the reference signal. A reference signal may be e.g. a DPCCH symbol for WCDMA or an LTE reference signal. In the following, a DPCCH symbol comprising pilot symbols and non-pilot symbols for WCDMA is used as an example. However, the embodiments herein are equally applicable to any type of reference signals. A DPCCH pilot symbol is a symbol which is completely known by the receiver while "non-pilot symbols" comprises control information. This control information is usually very robust coded such that it is possible to detect these "non-pilot symbols" very accurately. After detection, the "non-pilot symbols" may be considered as known and then used for channel estimation. In more detail, the first network node 301 receives at least one sample of the reference signal. A sample refers to a value or set of values at a point in time and/or space. Each sample of the reference signal may have an AGC scaling, a TPC scaling or both. The AGC scaling and/or the TPC scaling of a sample of the reference signal may be different from the AGC scaling and/or the TPC scaling of a previously received sample of the reference signal, e.g. there has been a change in the AGC and/or TPC scaling. Such AGC and/or TPC scaling may be seen as a change in the amplitude of the reference signal or as a time varying scaling due to AGC and TPC scaling.

Step 402

As a step 402, AGC compensation of any AGC scaling change is done by the first network node 301 such that all reference symbols in the reference signal have a common and constant AGC scaling. In other words, all time-varying AGC scaling is compensated for, i.e. removed, resulting in an AGC compensated signal with a constant AGC scaling. This common and constant AGC scaling may e.g. be chosen as the AGC scaling of the last received pilot symbol, such that all previously received pilot symbols are then multiplied with this common constant AGC scaling and divided by their respectively AGC scaling. If the channel estimate comprises state variables, then these must also be AGC scaled accordingly. This is described in more detail in FIG. 8. A state variable is one of the set of variables that are used to describe the mathematical "state" of a dynamical system. The AGC compensation of step 402 is performed before the TPC detection in step 403.

Step 403

The TPC scaling change of the reference signal is detected. From this detected change, the TPC command(s) applied to the received reference signal may be derived. This is described in more detail below. Within the TPC detection performed by the first network node 301, a predicted channel estimate is needed which will also be described in more detail below. The detection of the TPC scaling change may comprise detection of a first TPC command used before the TPC scaling change and a second TPC command used after the TPC scaling change, i.e. a plurality of samples are used in the TPC detection.

Step 404

The first network node 301 predicts the channel estimate needed by the TPC detector in step 403. The predicted channel estimate is a channel estimate based on received pilot symbols before the time instant with a potential TPC scaling change. The channel estimation might be used to calculate the predicted channel estimate.

The predicted channel estimate is based on previously received reference signals up to slot "m−1" and used in the TPC detection between slot "m−1" and slot "m", wherein the current reference signal is received in slot m, and wherein m is a positive integer. Thus, several samples of the reference signal are used for the predicted channel estimate.

Step 405

The predicted channel estimate, to be used in the TPC detector, is calculated from reference signals received up to, but not including, the TPC scaling change. This calculated predicted channel estimate is then used when reference signals are received after the TPC scaling change. In this delay one slot, the predicted channel estimate is stored between the receptions of reference signals of one slot to the reception of reference signals for the following slot.

Step 406

If the AGC scaling is changing between the samples of the reference signal used for the predicted channel estimate in step 404 and the samples of the reference signal used for the TPC detection in step 403, then the first network node 301 may perform an AGC rescaling of the predicted channel estimate. This rescaling is done as outlined in the step number 402 above.

For WCDMA, these changes in amplitude of the reference signal due to the TPC scaling occur at slot borders. The predicted channel estimate is then based on received samples of the reference signal up to slot "m−1" and used in the TPC detection in step 403 between slot "m−1" and slot "m". Here, "m" is a positive integer and larger than zero.

Step 407

After the TPC detection in step 403, all received reference symbols are compensated with differences in the scaling from detected TPC scaling change, in addition to the AGC compensation in step 402. For example, the pilot symbols received in previous slots may be divided by the detected TPC scaling change between slot "m−1" and slot "m". If the channel estimate comprises state variables, then these may also be scaled accordingly. The outcome of step 407 is an AGC and TPC compensated signal.

Step 408

The first network node 301 performs a channel estimation using the AGC and TPC compensated pilot symbols. An example embodiment of a channel estimation algorithm for WCDMA is given below.

Step 409

The channel estimator of the first network node 301 may deliver channel estimates at the same rate as reference symbols. For WCDMA, this reference symbol rate equals the DPCCH symbol rate which is 15 kHz, see section 5.2.1.1 in 3GPP TS 25.211, V11.3.0, corresponding to a spreading factor of 256. However, this rate might differ from the rate in which data symbols are received. The data symbols are transmitted on another physical channel compared to the reference signals. For WCDMA, the physical channels are created by using different spreading codes.

For WCDMA, the data rate on a Dedicated Physical Data CHannel (DPDCH) may be configured to be between 15 000 and 960 000 reference symbols/second and on Enhanced-DPCCH (E-DPCCH) between 15 000 and 1 920 000 reference symbols/second, see section 5.2.1 in 3GPP TS 25.211, V11.3.0. In such embodiment, the first network node 301 performs a rate adaptation of the channel estimates to the user data rate. One embodiment of a rate adaptation method is to calculate a linear interpolation between the channel estimates closest to the time position of reception of the data symbol. In another embodiment of the rate adaptation, the channel estimate for the time position which is closest in time to the time position of the data symbol is used. Other embodiments of rate adaption methods may comprise Rayleigh fading models together with Signal to Noise Ratio (SNR) and Doppler spread estimates. SNR is a measure that compares the level of a desired signal to the level of background noise. It is defined as the ratio of signal power to the noise power. The coherence time of the channel is related to a quantity known as the Doppler spread of the channel. When a user is moving, the user's velocity causes a shift in the frequency of the signal transmitted along each signal path. This phenomenon is known as the Doppler shift. Signals traveling along different paths may have different Doppler shifts, corresponding to different rates of change in phase. The difference in Doppler shifts between different signal components contributing to a single fading channel tap is known as the Doppler spread.

One feature of the rate adaption is that it use channel estimates without time varying scaling due to AGC and TPC.

For WCDMA, this rate adaption may comprise channel estimates from different slots. It is thus important that these channel estimates before the rate adaptation in step 409 do not have differences in scaling due to AGC and TPC commands.

Step 410

The first network node 301 performs an AGC and TPC scaling by multiplying the time varying scaling due to AGC and TPC scaling change with the rate adapted channel estimates such that the channel estimates describes both the impact of the radio channel on the received signal as well as the scaling due to AGC and TPC.

Step 411

Figure 4:
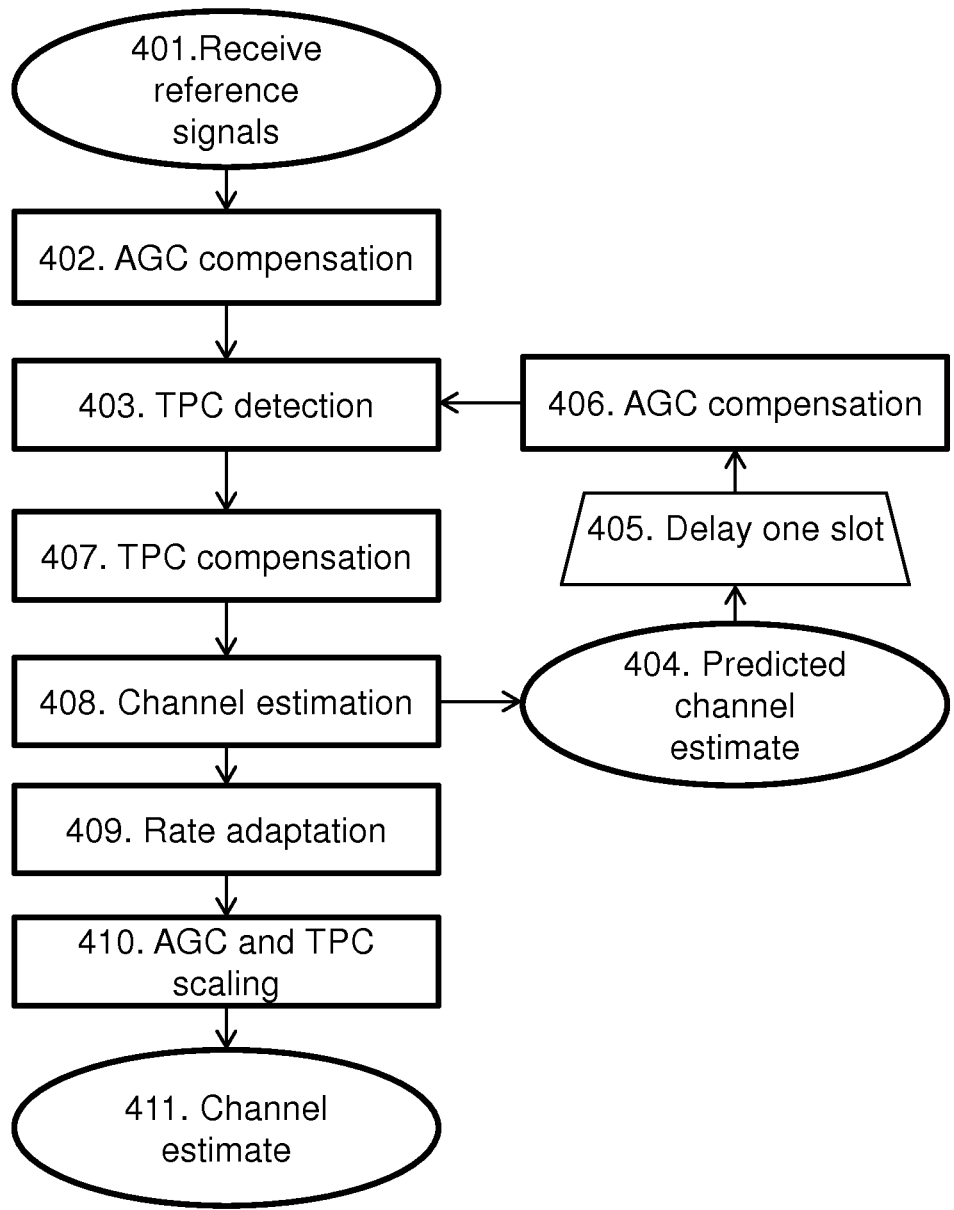
FIG. 4 is a flow chart illustrating embodiments of a method.

The result of the method described in FIG. 4 is a channel estimate describing both the radio channel as well as the scaling due to the AGC and TPC.

Channel Estimation

Figure 5:
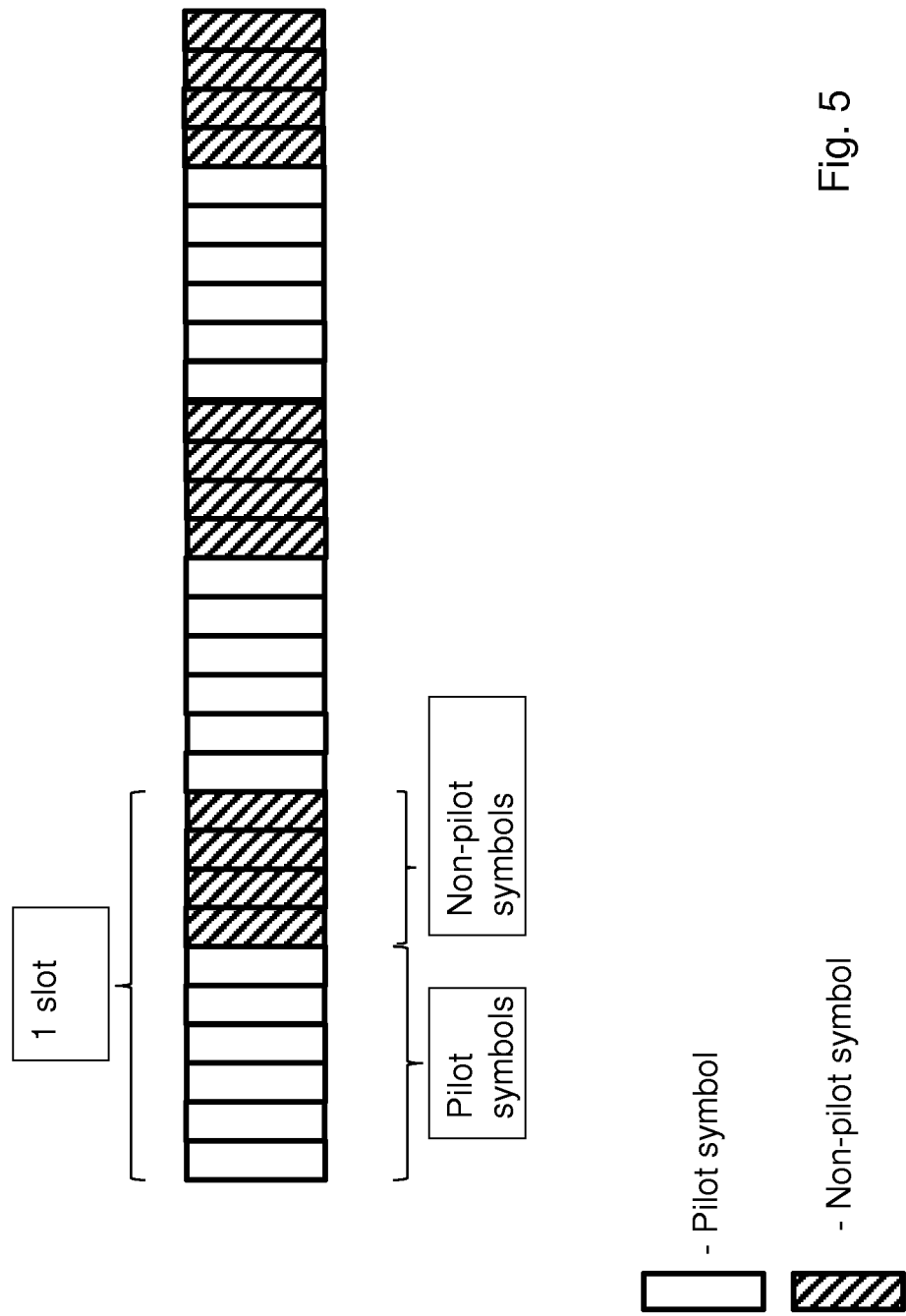
FIG. 5 is a schematic block diagram illustrating embodiments of slot a structure of WCDMA Dedicated Physical Control CHannel (DPCCH) channel with 6 pilot symbols and 4 non-pilot symbols in each slot.

The channel estimation in step 408 will now be described in more detail. Channel estimation for e.g. WCDMA is done separately for each RAKE finger and antenna by the use of received DPCCH symbols, see illustration in FIG. 5. The first network node 301 comprises a plurality of RAKE fingers and a plurality of antennas. A RAKE receiver mitigates multipath fading effects. The RAKE receiver does this by using several sub-receivers, also referred to as RAKE fingers. Each RAKE finger is delayed slightly in order to tune in to the individual multipath components. Here, both the pilot symbols and the so-called non-pilots symbols may be used in the channel estimation. The pilot symbols are seen in the white boxes and the non-pilots are seen in the hatched boxes. In FIG. 5, one slot is exemplified to comprise six pilot symbols and four non-pilot symbols. The non-pilots are then typically demodulated and detected with a temporary channel estimate, and may then be used as pilot symbols in the channel estimation, see a brief example below.

In order to reduce the impact of interference and additive noise, a processing (e.g. a linear filter) which comprises several received and de-spread DPCCH symbols (both pilots and non-pilots) over time may be used in forming a channel estimate. Furthermore, channel estimates are typically needed for several time instants within a slot, e.g. at DPCCH symbol rate (i.e. 15 symbols/second) or at the rate in which user data symbols are received (15 000 to 1 920 000 symbols/second, see section 5.2.1 in 3GPP TS 25.211, V11.3.0). Examples of such processing to get good channel estimates at the DPCCH rate may be mean value calculations, a weighted sum, or linear filtered version of several received and despread DPCCH symbols. However, with time varying AGC scaling and time varying TPC scaling, these channel estimates becomes biased. The channel estimates may thus be improved by modifying the received and despread signals to a common constant AGC scaling before any channel estimation processing is performed. In the same way, the impact of the TPC may be compensated.

WCDMA Channel Estimation with Non-Pilot Detection

Figure 6:
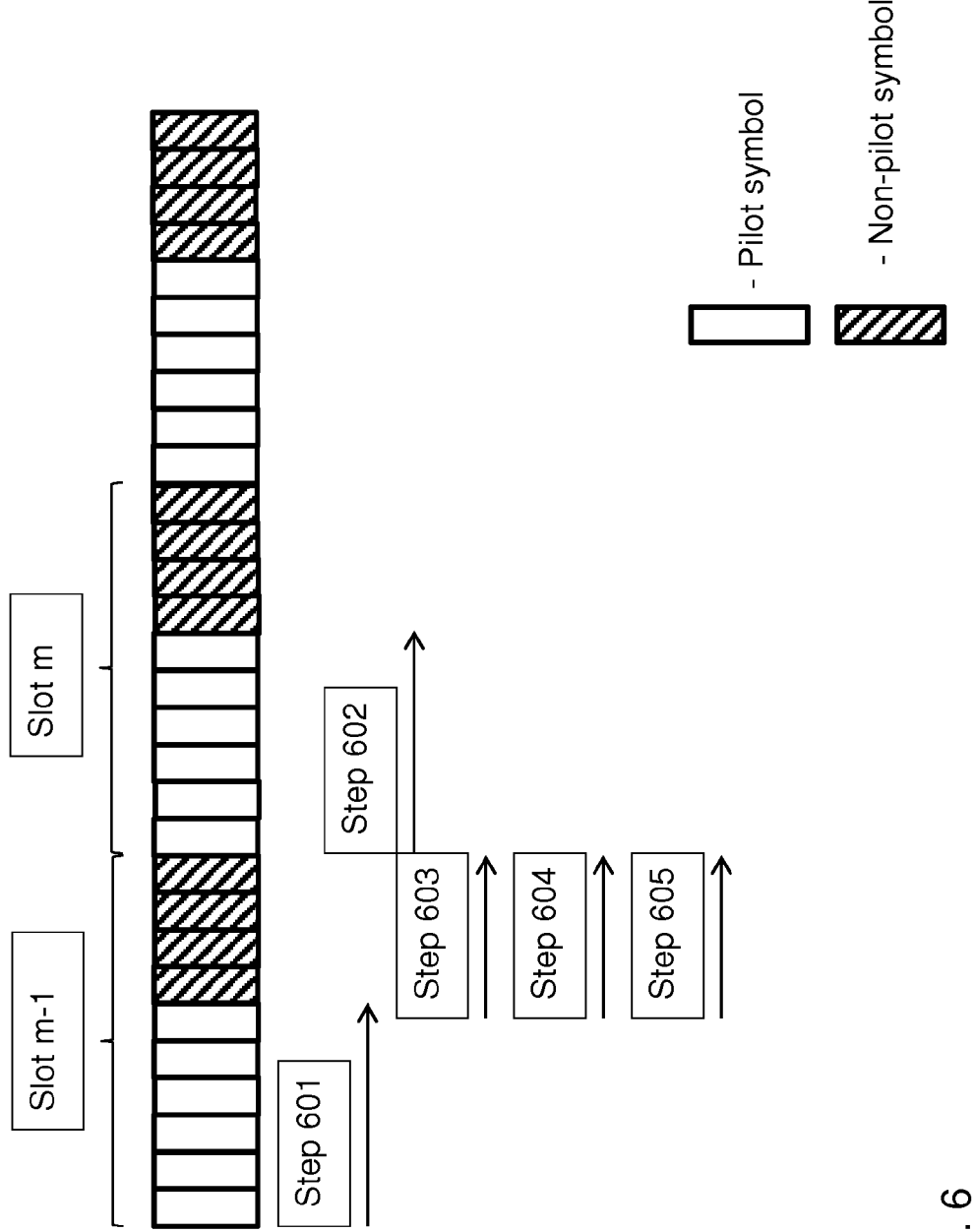
FIG. 6 is a schematic block diagram illustrating embodiments of a channel estimation in which the non-pilot symbols are demodulated and detected such that they may be used as pilot symbols.

The channel estimation for WCDMA in step 408 of FIG. 4 may be based on both pilot symbols and non-pilot DPCCH symbols. FIG. 6 illustrates an embodiment of substeps of step 408. In FIG. 6, the non-pilot symbols are demodulated and detected in order to use them as pilot symbols. In FIG. 6, slot "m−1" comprises six pilot symbols illustrated with blank boxes and four non-pilot symbols illustrated with grey boxes. Slot "m", which is a slot following slot "m−1", comprises six pilot symbols illustrated with white boxes and four non-pilot symbols illustrated with hatched boxes. Slot "m" is referred to as the current slot and slot "m−1" is referred to as the previous slot. The constant "m" is a positive integer larger than 0. The embodiment comprises the following steps seen in FIG. 6, which steps may be performed in any suitable order than described below:

Step 601

The first network node 301 estimates the channel using the pilot symbols of previous slot "m−1".

Step 602

The first network node 301 averages the received and demodulated pilot symbols of current slot "m".

Step 603

The first network node 301 interpolates the channel over the non-pilot symbols between the last channel estimate from step 601 and the average from step 602. These interpolated channel estimates are used as temporary channel estimates in the demodulation of step 604.

Step 604

The first network node 301 demodulates and detects the non-pilots symbols for slot "m−1" by the use of temporary channel estimates from step 603.

Step 605

The first network node 301 estimates the channel using the non-pilot symbols as pilot symbols in slot "m−1". The first network node 301 updates the slot index i.e. it sets "m=m+1" and returns to step 601.

TPC Detection for WCDMA

Step 403 of FIG. 4 will now be described in more detail and using the example of a WCDMA network.

Denoting the received and despread reference signals in step 401 for slot "m", DPCCH symbol "n", RAKE finger "r" and antenna "a" as follows in equation (1):

$$y(m,n,r,a)=h(m,n,r,a)+u(m,n,r,a). \qquad (1)$$

Figure 7:
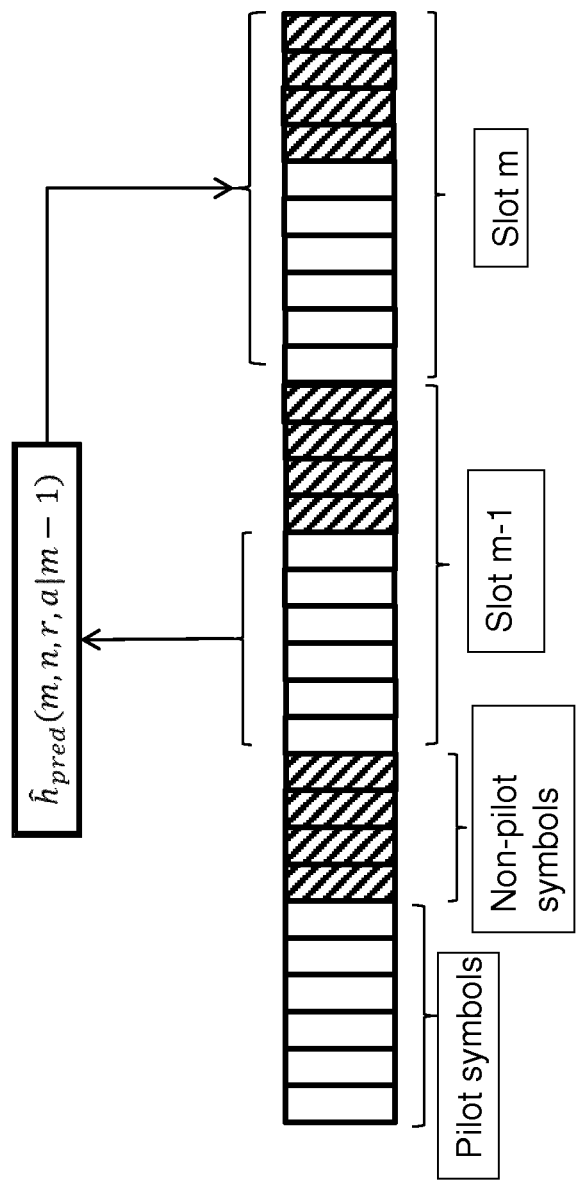
FIG. 7 is a schematic block diagram illustrating embodiments of the predicted channel estimate.

The first network node 301 assumes that the predicted channel estimate $\hat{h}_{pred}(m,n,r,a|m-1)$ is available for the current slot "m", based on samples of the received signal in a previous slot number "m−1", as illustrated in FIG. 7. This predicted channel estimate $\hat{h}_{pred}$ may e.g. be equal to the average of the pilot symbols of the previous slot or more advanced channel prediction based on e.g. a fading model. These advanced channel prediction based on channel models include methods when the correlation in time of the channel is modeled by statistical functions such as Bessel functions or Auto-Regressive models. The pilot symbols are illustrated with white boxes and the non-pilot symbols are illustrated with hatched boxes in FIG. 7.

The first network node 301 defines the TPC scaling amplitude as $\Delta=10^{1/20}$ or $\Delta=10^{2/20}$ (i.e. 1 or 2 dB in linear scale) if "algorithm 1" is used, and $\Delta=10^{1/20}$ if "algorithm 2" is used.

The first network node 301 bases the TPC detection of step 403 in FIG. 4 on calculations of the following decision metrics:

$$D_{up}=\Sigma_n\Sigma_r\Sigma_a|y(m,n,r,a)-\Delta\cdot h_{pred}(m,n,r,a|m-1)|^p \qquad (2)$$

$$D_{down}=\Sigma_n\Sigma_r\Sigma_a|y(m,n,r,a)-\Delta\cdot h_{pred}(m,n,r,a|m-1)|^p \qquad (3)$$

$$D_0=\Sigma_n\Sigma_r\Sigma_a|y(m,n,r,a)-h_{pred}(m,n,r,a|m-1)|^p \qquad (4)$$

where the summations typically span the pilot symbols "n" of current slot "m" with several rake fingers "r" and antennas "a", and where p defines the norm used. For example, p=1 corresponds to using the first norm. Another example is p=2 which corresponds to using the second norm i.e. $\|\cdot\|^2$ which denotes an absolute square.

For "algorithm 1", only the decision metrics $D_{up}$ (i.e. power increase) and $D_{down}$ (i.e. power decrease) are needed i.e.

$$\hat{\Delta}_{DPCCH} = \begin{cases} \Delta & \text{if } D_{UP} < D_{down} \\ \Delta^{-1} & \text{otherwise} \end{cases} \qquad (5)$$

The criterion $D_{up}<D_{down}$ used for "algorithm 1" for p=2 may be simplified to $$Re\{\Sigma_n\Sigma_r\Sigma_a y^*(m,n,r,a)\cdot h_{pred}(m,n,r,a|m-1)\} > \qquad (6)$$

$$\frac{(\Delta^2+1)}{2\Delta}\Sigma_n\Sigma_r\Sigma_a|h_{pred}(m,n,r,a|m-1)|^2$$

where * denotes a complex conjugate.

For "algorithm 2" all three decision metrics are needed, i.e.

$$\hat{\Delta}_{DPCCH} = \begin{cases} \Delta & \text{if } D_{UP} < D_0 \\ 1 & \text{if } D_0 < D_{down} \\ \Delta^{-1} & \text{otherwise} \end{cases} \qquad (7)$$

The criterion $D_{up}<D_0$ used for "algorithm 2" for p=2 may be simplified to $$\begin{aligned}&Re\{\Sigma_n\Sigma_r\Sigma_a y^*(m,n,r,a)\cdot h_{pred}(m,n,r,a|m-1)\}>\frac{1}{2}(\Delta+1)\\&\Sigma_n\Sigma_r\Sigma_a|h_{pred}(m,n,r,a|m-1)|^2\end{aligned} \qquad (8)$$

and the criterion $D_0<D_{down}$ may be simplified to $$Re\{\Sigma_n\Sigma_r\Sigma_a y^*(m,n,r,a)\cdot h_{pred}(m,n,r,a|m-1)\} > \qquad (9)$$

$$\frac{1}{2\Delta}(\Delta+1)\Sigma_n\Sigma_r\Sigma_a|h_{pred}(m,n,r,a|m-1)|^2$$

TPC Detection with Residual Decorrelation

The TPC detection performed by the first network node 301, as previously proposed, may also comprise a residual decorrelation by including a noise covariance matrix:

$$D_{up} = \Sigma_n \bar{\varepsilon}_{up}^H(m,n)C^{-1}(m)\bar{\varepsilon}_{up}(m,n), \qquad (10)$$

$$D_{down} = \Sigma_n \bar{\varepsilon}_{down}^H(m,n)C^{-1}(m)\bar{\varepsilon}_{down}(m,n), \qquad (11)$$

$$D_0 = \Sigma_n \bar{\varepsilon}_0^H(m,n)C^{-1}(m)\bar{\varepsilon}_0(m,n), \qquad (12)$$

where H denotes a complex conjugate transpose and where $\bar{\varepsilon}_{up}(m,n)$, $\bar{\varepsilon}_{down}(m,n)$, $\bar{\varepsilon}_0(m,n)$ are vectors with residuals:

$$\varepsilon_{up}(m,n,r,a)=y(m,n,r,a)-\Delta\cdot h_{pred}(m,n,r,a|m-1), \qquad (13)$$

$$\varepsilon_{down}(m,n,r,a)=y(m,n,r,a)-\Delta^{-1}\cdot h_{pred}(m,n,r,a|m-1), \qquad (14)$$

$$\varepsilon_0(m,n,r,a)=y(m,n,r,a)-h_{pred}(m,n,r,a|m-1), \qquad (15)$$

for all RAKE fingers and antennas of the first network node 301 and where $C^{-1}$ is the inverse of a residual covariance matrix C. This residual covariance matrix may be estimated by the first network node 301 e.g. based on unused spreading codes.

Figure 8A:
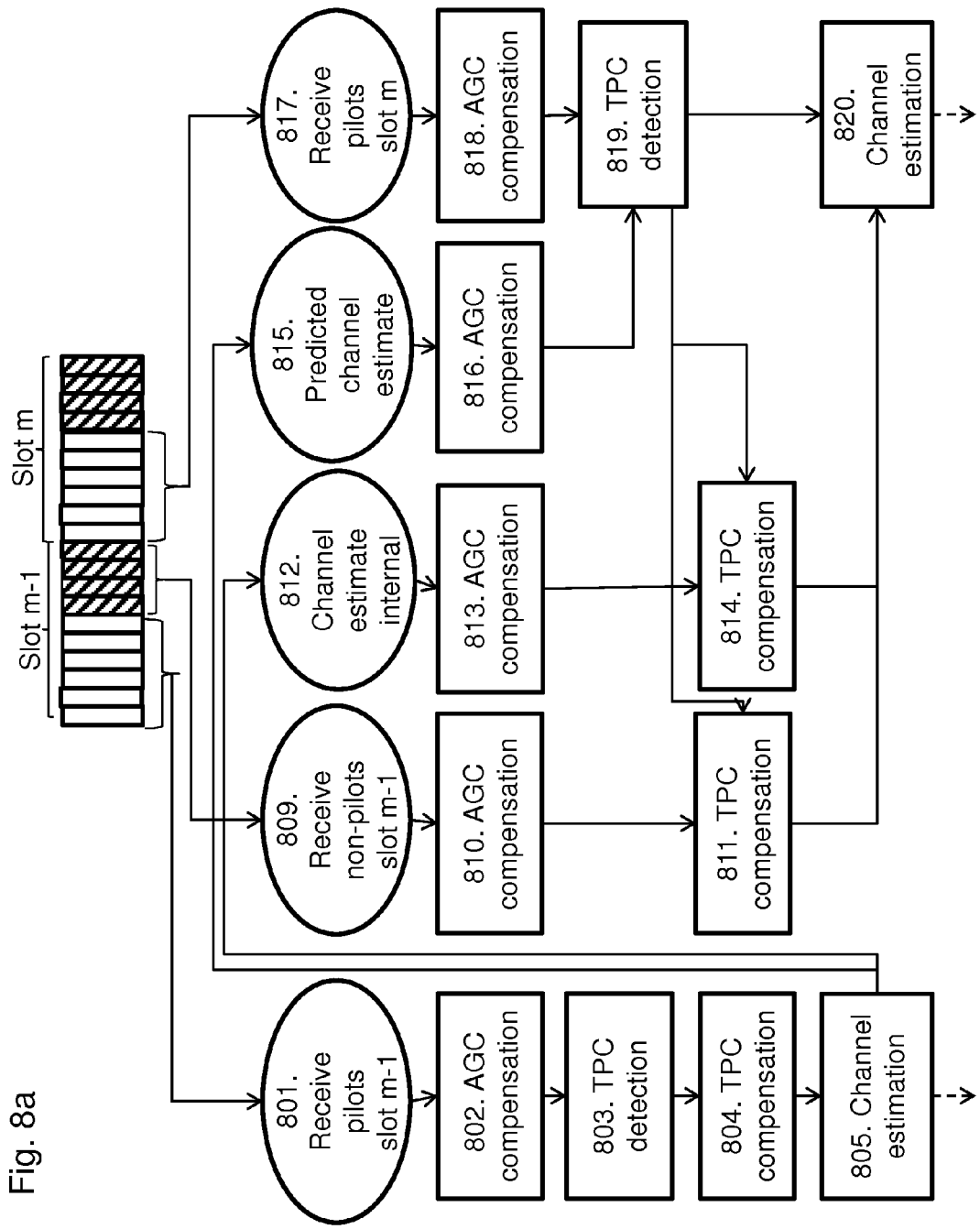

The method for handling AGC scaling and TPC scaling of a signal received from a second network node 305, according to some embodiments will now be described with reference to the combined flowchart depicted in FIGS. 8a and 8b. FIG. 8b is a continuation of FIG. 8a. The received reference signal is shown at the top of FIG. 8a. Slot "m−1"

comprises six pilot symbols represented by white boxes and four non-pilot symbols represented by hatched boxes. Slot "m" in FIG. 8a comprises six pilot symbols and four non-pilot symbols. The method comprises the following steps, which steps may as well be carried out in another suitable order than described below:

Step 801

This step is seen in FIG. 8a and is a step which corresponds to step 401 in FIG. 4. The first network node 301 receives six pilot symbols in slot "m−1".

Step 802

This step is seen in FIG. 8a and is a step which corresponds to step 402 in FIG. 4. The first network node 301 performs AGC compensation of each of the six pilot symbols received in the reference signal in slot "m−1" in step 801. The AGC compensation is for any AGC scaling change of the received signal. The AGC scaling change may be seen as a time varying AGC scaling. The resulting AGC compensated signal comprises a constant AGC scaling.

Step 803

This step is seen in FIG. 8a and is a step which corresponds to step 403 in FIG. 4. The first network node 301 performs TPC detection of all six pilot symbols from step 801 together, i.e. a TPC scaling change is detected.

Step 804

This step is seen in FIG. 8a and is a step which corresponds to step 407 in FIG. 4. The first network node 301 performs TPC compensation of the AGC compensated signal in step 802, which results in an AGC and TPC compensated signal. The TPC compensation is a compensation of the detected TPC scaling change. The AGC and TPC compensated signal comprises all six pilot symbols. The AGC and TPC compensated signal comprises the constant AGC scaling and a constant TPC scaling according to the detected TPC scaling change.

Step 805

This step is seen in FIGS. 8a and 8b, and is a step which corresponds to step 408 in FIG. 4. The first network node 301 derives an internal channel estimate based on the AGC and TPC compensated signal from step 804.

Step 806

This step is seen in FIG. 8b and is a step which corresponds to step 409 in FIG. 4. The first network node 301 performs rate adaptation of the channel estimate from step 805.

Step 807

This step is seen in FIG. 8b and is a step which corresponds to step 410 in FIG. 4. The first network node 301 applies the AGC and TPC scaling from which the signal previously was compensated.

Step 808

This step is seen in FIG. 8b. The result of the AGC and TPC scaling in step 807 is a channel estimate for slot "m−2".

Step 809

This step is seen in FIG. 8a and is a step which corresponds to step 401 in FIG. 4. The first network node 301 receives four non-pilot symbols in the reference signal in slot "m−1".

Step 810

This step is seen in FIG. 8a and is a step which corresponds to step 402 in FIG. 4. The first network node 301 performs AGC compensation of the non-pilot symbols received in the reference signal in slot "m−1". The AGC compensation is a compensation for any AGC scaling change of the signal. The AGC scaling change may be caused by a varying AGC scaling.

Step 811

This step is seen in FIG. 8a and is a step which corresponds to step 407 in FIG. 4. The first network node 301 performs TPC compensation of the four non-pilot symbols in slot "m−1" received in step 809, resulting in a TPC compensated signal. The TPC compensation is a compensation for a TPC scaling change.

The TPC compensation 811 receives TPC detection results from step 819. TPC detection is not performed on the non-pilot symbols in slot "m−1" because the non-pilot symbols cannot be used in the TPC detection because they are unknown. The non-pilot symbols of slot "m−1" are detected in the channel estimate in step 820 after receiving the pilot symbols of slot "m".

Step 812

This step is seen in FIG. 8a. The first network node 301 provides channel estimate internal signals based on the channel estimate from step 805.

Step 813

This step is seen in FIG. 8a and is a step which corresponds to step 402 in FIG. 4. The first network node 301 performs AGC compensation of the internal channel estimate from step 805. The AGC compensation is a compensation of an AGC scaling change.

Step 814

This step is seen in FIG. 8a and is a step which corresponds to step 407 in FIG. 4. The first network node 301 performs TPC compensation of the internal channel estimate from step 805, i.e. a compensation of a TPC scaling change. The TPC compensation in step 814 receives TPC detection results from step 819. The TPC compensating of step 814 receives the detected TPC scaling from step 819.

Step 815

This step is seen in FIG. 8a and is a step which corresponds to step 404 in FIG. 4. In some embodiments, the first network node 301 predicts a channel estimate based on the channel estimate from step 805.

Step 816

This step is seen in FIG. 8a and is a step which corresponds to step 406 in FIG. 4. In some embodiments, the first network node 301 performs an AGC compensation of any AGC scaling changes of the predicted channel estimate from step 815.

Step 817

This step is seen in FIG. 8a and is a step which corresponds to step 401 in FIG. 4. The first network node 301 receives six pilot symbols in the reference signal in slot "m".

Step 818

This step is seen in FIG. 8a and is a step which corresponds to step 402 in FIG. 4. The first network node 301 performs AGC compensation of any AGC scaling change of the pilot symbols received in the reference signal in slot "m".

Step 819

This step is seen in FIG. 8a and is a step which corresponds to step 403 in FIG. 4. The first network node 301 performs TPC detection of a TPC scaling change of the pilot symbol received in step 817. The TPC detection may be based on the predicted channel estimate from step 815 or from the AGC compensated predicted channel estimate from step 816.

Step 820

This step is seen in FIGS. 8a and 8b, and is a step which corresponds to step 408 in FIG. 4. The first network node 301 derives a channel estimate based on the AGC compensated signal from step 818 and the TPC compensated signals from steps 811 and 814.

Step 821

This step is seen in FIG. 8*b* and is a step which corresponds to step 409 in FIG. 4. The first network node 301 performs rate adaptation of the derived channel estimate form step 820.

Step 822

This step is seen in FIG. 8*b* and is a step which corresponds to step 410 in FIG. 4. The first network node 301 performs AGC and TPC scaling by applying the AGC and TPC scaling from which the signal previously was compensated.

Step 823

This step is seen in FIG. 8*b*. The result of the AGC and TPC scaling in step 822 is a channel estimate for slot "m−1".

As a result of the steps of FIG. 8, a channel estimate for the slot "m−1" and for the slot "m−2" is produced.

Even though the above example embodiments uses six pilot symbols and four non-pilot symbols, any other suitable number of pilot and non-pilot symbols may be applicable. For example, the number of pilot symbols may be configured to be any number between 3 and 8, i.e. 3, 4, 5, 6, 7 or 8. In total, there may be 10 bits per slot for DPCCH. If there are 3 pilot symbols there are 7 non-pilot symbols in a slot. If there are 4 pilot symbols there are 6 non-pilot symbols. If there are 5 pilot symbols there are 5 non-pilot symbols. If there are 6 pilot symbols there are 4 non-pilot symbols. If there are 7 pilot symbols there are 3 non-pilot symbols. If there are 8 pilot symbols there are 2 non-pilot symbols.

Figure 9A:
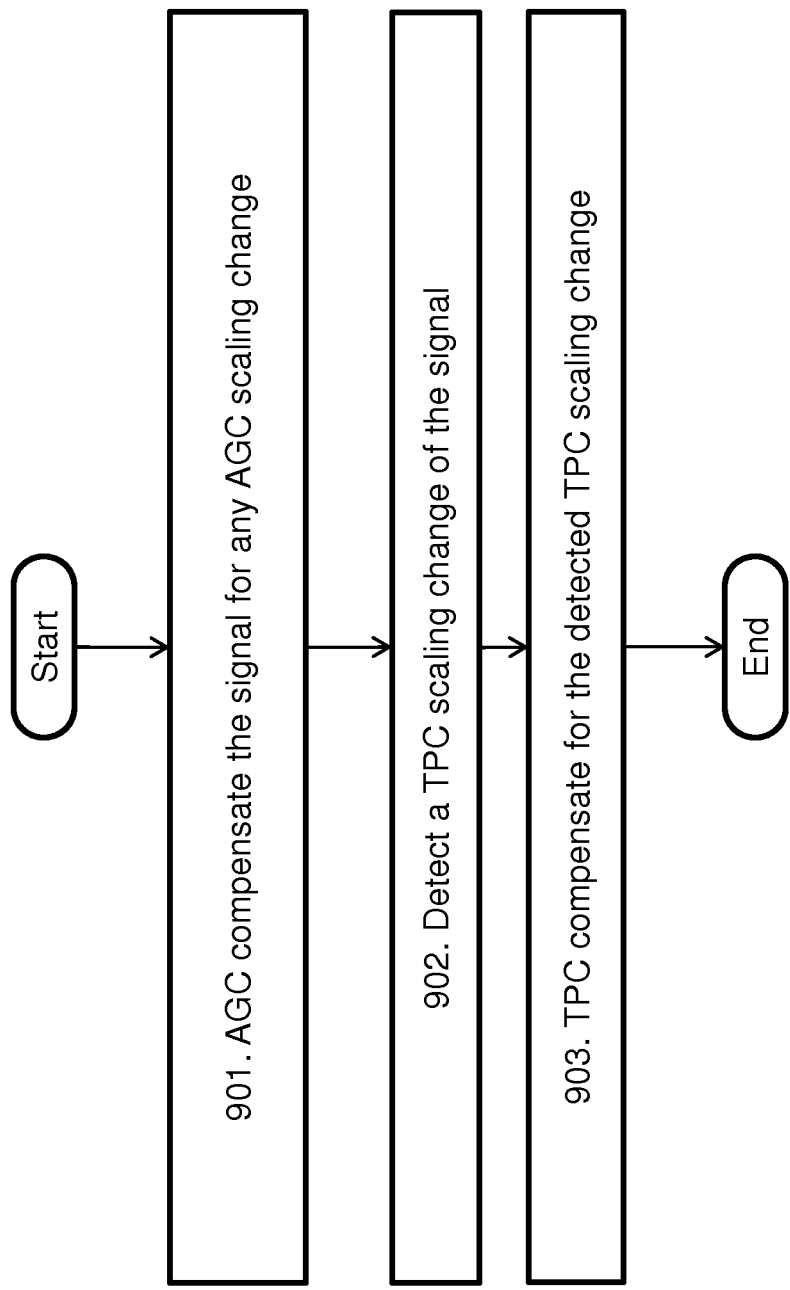
FIG. 9a-c are flow charts illustrating embodiments of a method in a first network node.
Figure 9B:
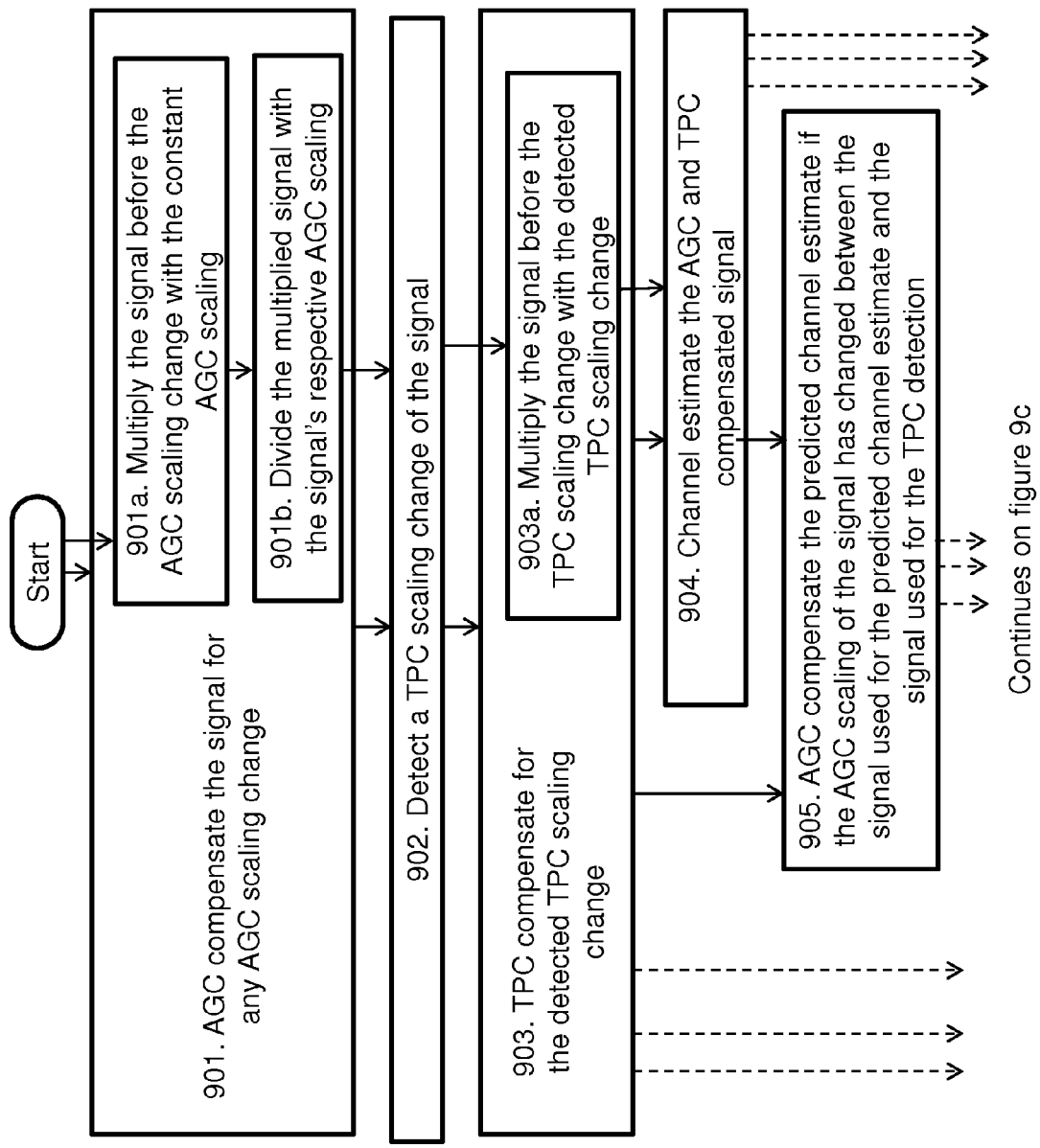
Figure 9C:
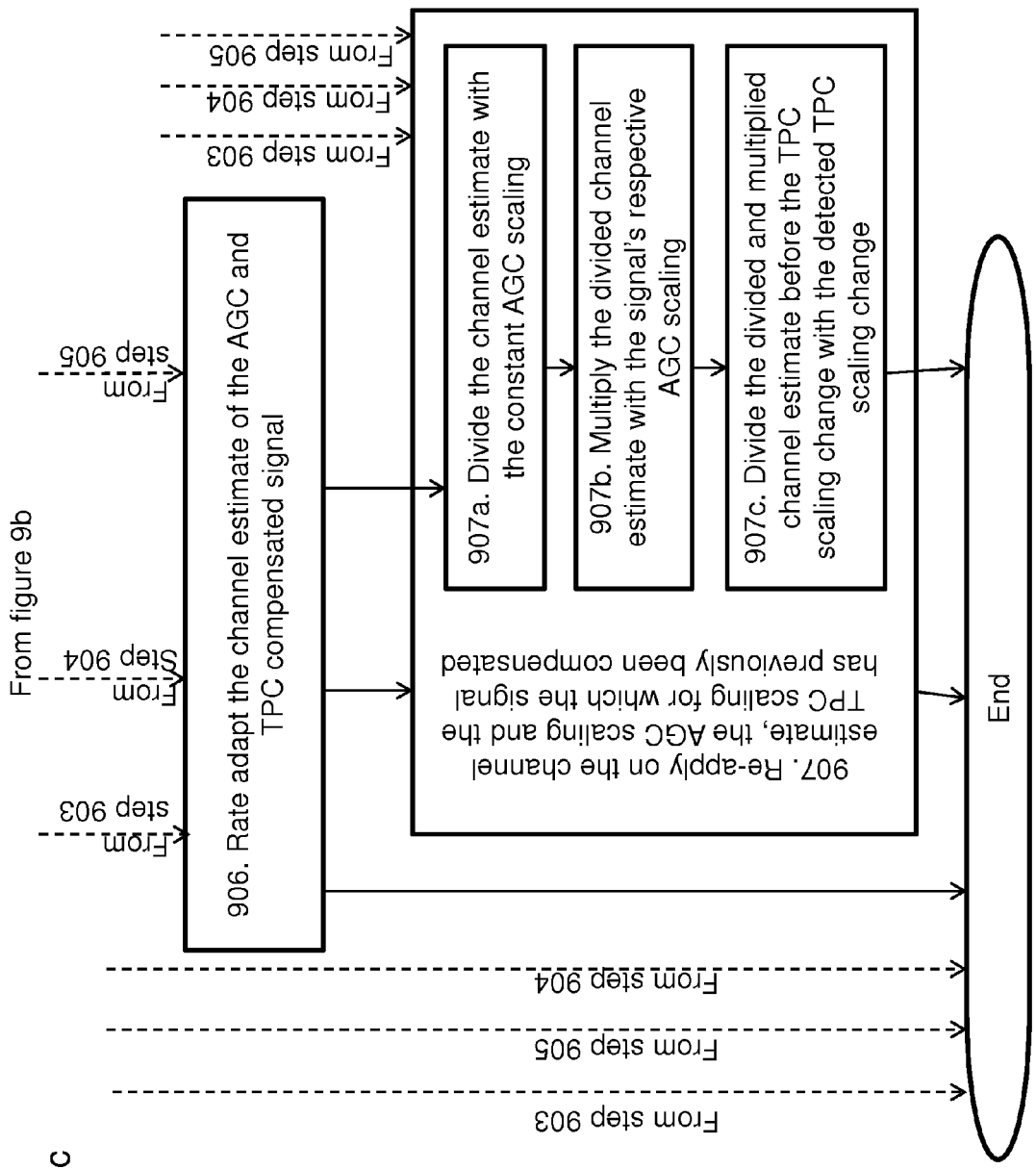

The method described above will now be described seen from the perspective of the first network node 301. FIGS. 9*a-c* are flowcharts describing the present method in the first network node 301 for handling AGC scaling and TPC scaling of a signal received from a second network node 305. The signal may be a reference signal comprising pilot symbols and non-pilot symbols. FIG. 9*a* illustrates steps 901, 902 and 903. FIG. 9*b* illustrates steps 901, 901*a*, 901*b*, 902, 903, 903*a*, 904 and 905. FIG. 9*c* illustrates steps 906, 907, 907*a*, 907*b* and 907*c*. The method comprises the following steps to be performed by the first network node 301:

Step 901

This step is seen in FIGS. 9*a* and 9*b*. This step corresponds to step 402 in FIG. 4, steps 802, 810 and 818 in FIG. 8. The first network node 301 AGC compensates the signal for any AGC scaling change. The AGC scaling change may be seen as a varying AGC scaling. The AGC compensation results in an AGC compensated signal comprising a constant AGC scaling.

Step 901*a*

This step is seen in FIG. 9*b*. This step corresponds to step 402 in FIG. 4 and steps 802, 810, 813 and 818 in FIG. 8. This step is a substep of step 901. In some embodiments, the first network node 301 multiplies the signal before the AGC scaling change with the constant AGC scaling.

Step 901*b*

This step is seen in FIG. 9*b*. This step corresponds to step 402 and steps 802, 810 and 818 in FIG. 8. This step is a substep of step 901 and a step that is performed after substep 901*a*. In some embodiments, the first network node divides the multiplied signal with the signal's respective AGC scaling.

Step 902

This step is seen in FIGS. 9*a* and 9*b*. This step corresponds to step 403 in FIG. 4 and to steps 803 and 819 in FIG. 8. The first network node 301 detects a TPC scaling change of the signal. The detection is based on the signal after the TPC scaling change and based on a predicted channel estimate. The predicted channel estimate is based on the signal before the TPC scaling change.

In some embodiments, an amplitude of the signal before the TPC scaling change is compared with the amplitude of the signal after the TPC scaling change in order to detect the TPC scaling change. In some embodiments, the TPC scaling change is an expected TPC scaling which occurs at a slot border.

In some embodiments, the predicted channel estimate is based on a fading model.

In some embodiments, the detection of the TPC scaling change is based on the AGC compensated predicted channel estimate.

Step 903

This step is seen in FIGS. 9*a* and 9*b*. This step corresponds to step 407 in FIG. 4 and steps 804, 811 and 814 in FIG. 8. The first network node 301 TPC compensates for the detected TPC scaling change. The TPC compensation results in an AGC and TPC compensated signal comprising the constant AGC scaling and a constant TPC scaling according to the detected TPC scaling change.

In some embodiments, the constant AGC scaling is selected to be an AGC scaling of the signal after the AGC scaling change.

Step 903*a*

This step is seen in FIG. 9*b*. This step corresponds to step 407 in FIG. 4 and steps 804, 811 and 814 in FIG. 8. This is a substep of step 903. In some embodiments, the first network node 301 multiplies the signal before the TPC scaling change with the detected TPC scaling change.

Step 904

This step is seen in FIG. 9*b*. This step corresponds to step 408 in FIG. 4 and steps 805 and 820 in FIG. 8. In some embodiments, the first network node 301 channel estimates the AGC and TPC compensated signal, i.e. it derives a channel estimate of the AGC and TPC compensated signal.

Step 905

This step is seen in FIG. 9*b*. This step corresponds to step 406 in FIG. 4 and step 816 in FIG. 8. In some embodiments, the first network node 301 AGC compensates the predicted channel estimate if the AGC scaling of the signal has changed between the signal used for the predicted channel estimate and the signal used for the TPC detection.

Step 906

This step is seen in FIG. 9*c*. This step corresponds to step 409 in FIG. 4 and steps 806 and 821 in FIG. 8. In some embodiments, the first network node 301 rate adapts the channel estimate of the AGC and TPC compensated signal.

Step 907

This step is seen in FIG. 9*c*. This step corresponds to step 410 in FIG. 4 and steps 807 and 822 in FIG. 8. In some embodiments, the first network node 301 re-applies, on the channel estimate from step 408 or step 409, the AGC scaling and the TPC scaling for which the signal has previously been compensated.

Step 907*a*

This step is seen in FIG. 9*c*. This step corresponds to step 410 in FIG. 4. This is a substep of step 907. In some embodiments, the first network node 301 divides the channel estimate with the constant AGC scaling.

Step 907*b*

This step is seen in FIG. 9*c*. This step corresponds to step 410 in FIG. 4. This is a substep of step 907. In some embodiments, the first network node 301 multiplies the divided channel estimate with the signal's respective AGC scaling.

Step 907*c*

This step is seen in FIG. 9*c*. This step corresponds to step 410 in FIG. 4. This step is a substep of step 907. In some embodiments, the first network node 301 divides the divided and multiplied channel estimate before the TPC scaling change with the detected TPC scaling change. The steps 907*a*, 907*b* and 907*c* may be performed in any suitable order.

Figure 10:
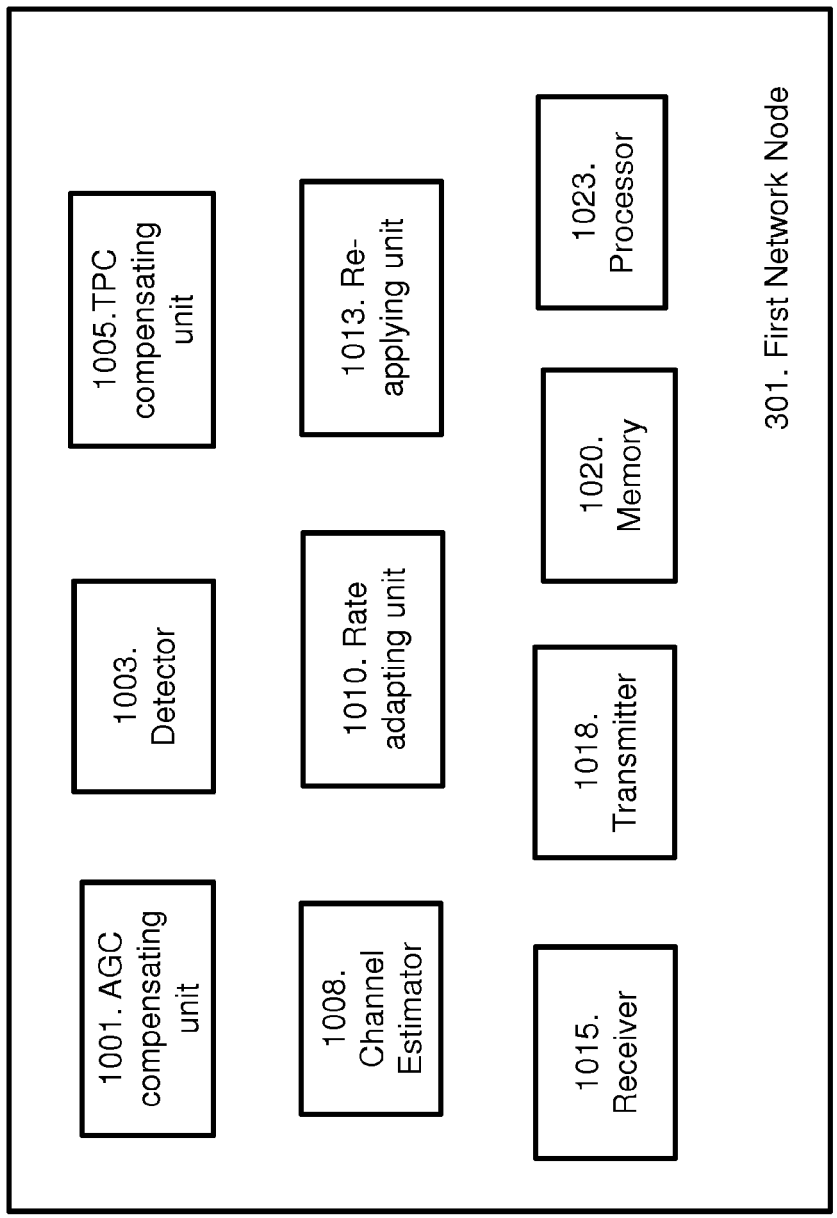
FIG. 10 is a schematic block diagram illustrating embodiments of a first network node.

To perform the method steps shown in FIGS. 9*a-c* for handling AGC scaling and TPC scaling of a signal received from a second network node 305 the first network node 301 comprises an arrangement as shown in FIG. 10.

The first network node 301 comprises an AGC compensating unit 1001 which is adapted to AGC compensate the signal for any AGC scaling change. The AGC scaling change may be seen as a varying AGC scaling. The AGC compensation results in an AGC compensated signal comprising a constant AGC scaling. In some embodiments, the AGC compensating unit 1001 is further adapted to AGC compensate the predicted channel estimate if the AGC scaling of the signal has changed between the signal used for the predicted channel estimate and the signal used for the TPC detection. In some embodiments, the AGC compensating unit 1001 is further adapted to multiply the signal before the AGC scaling change with the constant AGC scaling, and adapted to divide the multiplied signal with the signal's respective AGC scaling. In some embodiments, the constant AGC scaling is selected to be an AGC scaling of the signal after the AGC scaling change.

The first network node 301 comprises a detector 1003 which is adapted to detect a TPC scaling change of the signal. The detection is based on the signal after the TPC scaling change and based on a predicted channel estimate. The predicted channel estimate is based on the signal before the TPC scaling change. In some embodiments, the detector 1003 is adapted to compare an amplitude of the signal before the TPC scaling change with the amplitude of the signal after the TPC scaling change in order to detect the TPC scaling change. In some embodiments, the predicted channel estimate is based on a fading model. In some embodiments, the detector 1003 is further adapted to detect the TPC scaling change based on the AGC compensated predicted channel estimate.

The first network node 301 comprises a TPC compensating unit 1005 which is adapted to TPC compensate for the detected TPC scaling change. The TPC compensation results in an AGC and TPC compensated signal comprising the constant AGC scaling and a constant TPC scaling according to the detected TPC scaling change. In some embodiments, the TPC compensating unit 1005 is further adapted to multiply the signal before the TPC scaling change with the detected TPC scaling change.

The first network node 301 may further comprise a channel estimator 1008 which is adapted to channel estimate the AGC and TPC compensated signal.

The first network node 301 may further comprise a rate adapting unit 1010 which is adapted to rate adapt the channel estimate of the AGC and TPC compensated signal.

The first network node 301 may further comprise a re-applying unit 1013 which is adapted to re-apply on the channel estimate, the AGC scaling and the TPC scaling for which the signal has previously been compensated. In some embodiments, the re-applying unit 1013 is further adapted to divide the channel estimate with the constant AGC scaling, multiply the divided channel estimate with the signal's respective AGC Scaling, and adapted to divide the divided and multiplied channel estimate before the change in TPC scaling with the detected TPC scaling change.

The first network node 301 may comprise a receiver 1015 which is adapted to receive reference signals, pilot symbols, non-pilot symbols etc. from the second network node 305.

The first network node 305 may comprises a transmitter 1018 which is adapted to transmit signals to other nodes in the communications network 300, such as e.g. the second network node 305.

The first network node 301 may further comprise a memory 1020 comprising one or more memory units. The memory 1020 is arranged to be used to store data, received data streams, power level measurements, signals, pilot symbols, non-pilot symbols, AGC compensated signals, TPC compensate signals, detected TPC scaling changes, TPC commands, channel estimates, rate adapted signals, AGC scaling, TPC scaling, predicted channel estimates, channel estimate internal values, amplitudes, threshold values, time periods, configurations, schedulings, and applications to perform the methods herein when being executed in the first network node 301.

The present mechanism for handling AGC scaling and TPC scaling of a signal received from a second network node 305 may be implemented through one or more processors, such as a processor 1023 in the first network node 301 depicted in FIG. 10 together with computer program code for performing the functions of the embodiments herein. The processor may be for example a Digital Signal Processor (DSP), Application Specific Integrated Circuit (ASIC) processor, Field-Programmable Gate Array (FPGA) processor or microprocessor. The program code mentioned above may also be provided as a computer program product, for instance in the form of a data carrier carrying computer program code for performing the embodiments herein when being loaded into the first network node 301. One such carrier may be in the form of a CD ROM disc. It is however feasible with other data carriers such as a memory stick. The computer program code may furthermore be provided as pure program code on a server and downloaded to the first network node 301.

Those skilled in the art will also appreciate that the AGC compensating unit 1001, the detector 1003, the TPC compensating unit 1005, the channel estimator 1008, the rate adapting unit 1010, the re-applying unit 1013, the receiver 1015 and the transmitter 1018 described above may refer to a combination of analog and digital circuits, and/or one or more processors configured with software and/or firmware, e.g. stored in a memory, that when executed by the one or more processors such as the processor 1023 perform as described above.

The embodiments herein are not limited to the above described embodiments. Various alternatives, modifications and equivalents may be used. Therefore, the above embodiments should not be taken as limiting the scope of the embodiments, which is defined by the appending claims.

It should be emphasized that the term "comprises/comprising" when used in this specification is taken to specify the presence of stated features, integers, steps or components, but does not preclude the presence or addition of one or more other features, integers, steps, components or groups thereof. It should also be noted that the words "a" or "an" preceding an element do not exclude the presence of a plurality of such elements. The term "configured to" used herein may also be referred to as "arranged to" or "adapted to".

It should also be emphasized that the steps of the methods defined in the appended claims may, without departing from the embodiments herein, be performed in another order than the order in which they appear in the claims.

The invention claimed is:

1. A method, in a first network node, for handling Automatic Gain Control (AGC) scaling and Transmit Power Control (TPC) scaling of a signal received from a second network node, the method comprising:
   AGC compensating the signal for any AGC scaling changes, wherein the AGC compensating the signal results in an AGC compensated signal comprising a constant AGC scaling;
   detecting a TPC scaling change of the signal, wherein the detection is based on the signal after the TPC scaling change and based on a predicted channel estimate, wherein the predicted channel estimate is based on the signal before the TPC scaling change; and
   TPC compensating for the detected TPC scaling change, wherein the TPC compensating results in an AGC and TPC compensated signal comprising the constant AGC scaling and a constant TPC scaling according to the detected TPC scaling change.

2. The method of claim 1, wherein an amplitude of the signal before the TPC scaling change is compared with the amplitude of the signal after the TPC scaling change in order to detect the TPC scaling change.

3. The method of claim 1, wherein the predicted channel estimate is based on a fading model.

4. The method of claim 1:
   further comprising AGC compensating the predicted channel estimate in response to the AGC scaling of the signal having changed between the signal used for the predicted channel estimate and the signal used for the TPC detection; and
   wherein the detecting the TPC scaling change is based on the AGC compensated predicted channel estimate.

5. The method of claim 1, wherein the AGC compensating the signal for any AGC scaling change comprises:
   multiplying the signal before the AGC scaling change with the constant AGC scaling; and
   dividing the multiplied signal with the signal's respective AGC scaling.

6. The method of claim 1, wherein the constant AGC scaling is selected to be an AGC scaling of the signal after the AGC scaling change.

7. The method of claim 1, wherein the TPC compensating comprises multiplying the signal before the TPC scaling change with the detected TPC scaling change.

8. The method of claim 1, further comprising channel estimating the AGC and TPC compensated signal.

9. The method according to claim 8, further comprising rate adapting the channel estimate of the AGC and TPC compensated signal.

10. The method of claim 9, further comprising re-applying, on the channel estimate, the AGC scaling and the TPC scaling for which the signal has previously been compensated.

11. The method of claim 10, wherein the re-applying the AGC scaling and the TPC scaling comprises:
   dividing the channel estimate with the constant AGC scaling;
   multiplying the divided channel estimate with the signal's respective AGC scaling; and
   dividing the divided and multiplied channel estimate before the TPC scaling change with the detected TPC scaling change.

12. A first network node for handling Automatic Gain Control (AGC) scaling and Transmit Power Control (TPC) scaling of a signal received from a second network node, the first network node comprising:
   one or more processing circuits;
   memory containing instructions executable by the one or more processing circuits whereby the one or more processing circuits are configured to function as:
      an AGC compensating circuit configured to AGC compensate the signal for any AGC scaling change, wherein the AGC compensation results in an AGC compensated signal comprising a constant AGC scaling;
      a detector configured to detect a TPC scaling change of the signal, wherein the detection is based on the signal after the change in TPC scaling change and based on a predicted channel estimate, wherein the predicted channel estimate is based on the signal before the TPC scaling change; and
      a TPC compensating circuit adapted to TPC compensate for the detected TPC scaling change, wherein the TPC compensation results in an AGC and TPC compensated signal comprising the constant AGC scaling and a constant TPC scaling according to the detected TPC scaling change.

13. The first network node of claim 12, wherein the detector is configured to compare an amplitude of the signal before the TPC scaling change with the amplitude of the signal after the TPC scaling change in order to detect the TPC scaling change.

14. The first network node of claim 12, wherein the predicted channel estimate is based on a fading model.

15. The first network node of claim 12:
   wherein the AGC compensating circuit is configured to AGC compensate the predicted channel estimate in response to the AGC scaling of the signal having changed between the signal used for the predicted channel estimate and the signal used for the TPC detection; and
   wherein the detector is configured to detect the TPC scaling change based on the AGC compensated predicted channel estimate.

16. The first network node of claim 12, wherein the AGC compensating circuit is configured to:
   multiply the signal before the AGC scaling change with the constant AGC scaling; and
   divide the multiplied signal with the signal's respective AGC scaling.

17. The first network node of claim 12, wherein the constant AGC scaling is selected to be an AGC scaling of the signal after AGC scaling change.

18. The first network node of claim 12, wherein the TPC compensating circuit is configured to multiply the signal before the TPC scaling change with the detected TPC scaling change.

19. The first network node of claim 12, further comprising a channel estimator circuit configured to channel estimate the AGC and TPC compensated signal.

20. The first network node of claim 19, further comprising a rate adapting circuit configured to rate adapt the channel estimate of the AGC and TPC compensated signal.

21. The first network node of claim 19, further comprising a re-applying circuit configured to re-apply on the channel estimate, the AGC scaling, and the TPC scaling for which the signal has previously been compensated.

22. The first network node of claim 21, wherein the re-applying unit is configured to:
   divide the channel estimate with the constant AGC scaling;

multiply the divided channel estimate with the signal's respective AGC scaling; and divide the divided and multiplied channel estimate before the TPC scaling change with the detected TPC scaling change.

* * * * *